United States Patent [19]
Lawrence et al.

[11] Patent Number: 5,555,277
[45] Date of Patent: Sep. 10, 1996

[54] TECHNIQUE FOR CANCELLING COMMON MODE SWITCHING NOISE TO ACHIEVE REDUCED ERROR RATES IN A LOCAL AREA NETWORK

[75] Inventors: Charles E. Lawrence, Lytle; Floyd H. McDougall; Jay W. Lundschen, both of San Antonio, all of Tex.

[73] Assignee: Datapoint Corporation, San Antonio, Tex.

[21] Appl. No.: 160,593

[22] Filed: Dec. 1, 1993

[51] Int. Cl.[6] ............................................. H03D 1/04
[52] U.S. Cl. ........................ 375/346; 375/345; 375/285
[58] Field of Search .................................. 375/345, 286, 375/292, 285, 286, 292, 345, 346; 329/349; 370/24, 32

[56] References Cited

U.S. PATENT DOCUMENTS

| | | | |
|---|---|---|---|
| 3,619,503 | 11/1971 | Ragsdale | 375/345 |
| 3,668,643 | 6/1972 | Germain | 375/286 |
| 3,760,277 | 9/1973 | Whang | 375/345 |
| 3,980,676 | 10/1976 | Whang | 375/345 |
| 4,335,361 | 6/1982 | Acker | 330/285 |
| 4,637,064 | 11/1987 | Roberts et al. | 455/67 |
| 5,050,189 | 9/1991 | Cox et al. | 375/39 |
| 5,109,391 | 4/1992 | Kurobe | 375/286 |
| 5,124,980 | 6/1992 | Maki | 375/345 |

*Primary Examiner*—Edward L. Coles, Sr.
*Assistant Examiner*—Thomas L. Stoll
*Attorney, Agent, or Firm*—John R. Ley

[57] ABSTRACT

Improved gain control is obtained in each receiver of a LAN interface or hub in a LAN of the type using amplitude critical signals for conveying information. An evaluation circuit compares a signal representing a calibration value to a predetermined limits and adjusts the gain by one of a plurality of amplification levels to maintain a high level signals which are more accurately decoded into digital information. Improved noise cancellation is also obtained by creating a primary copy and an inverted copy of the received amplitude critical signal, amplifying the primary and inverted copy signals by the same predetermined amount and adding the amplified signals. The addition reinforces the value of the received amplitude critical signal while effectively subtracting the noise effects.

15 Claims, 8 Drawing Sheets

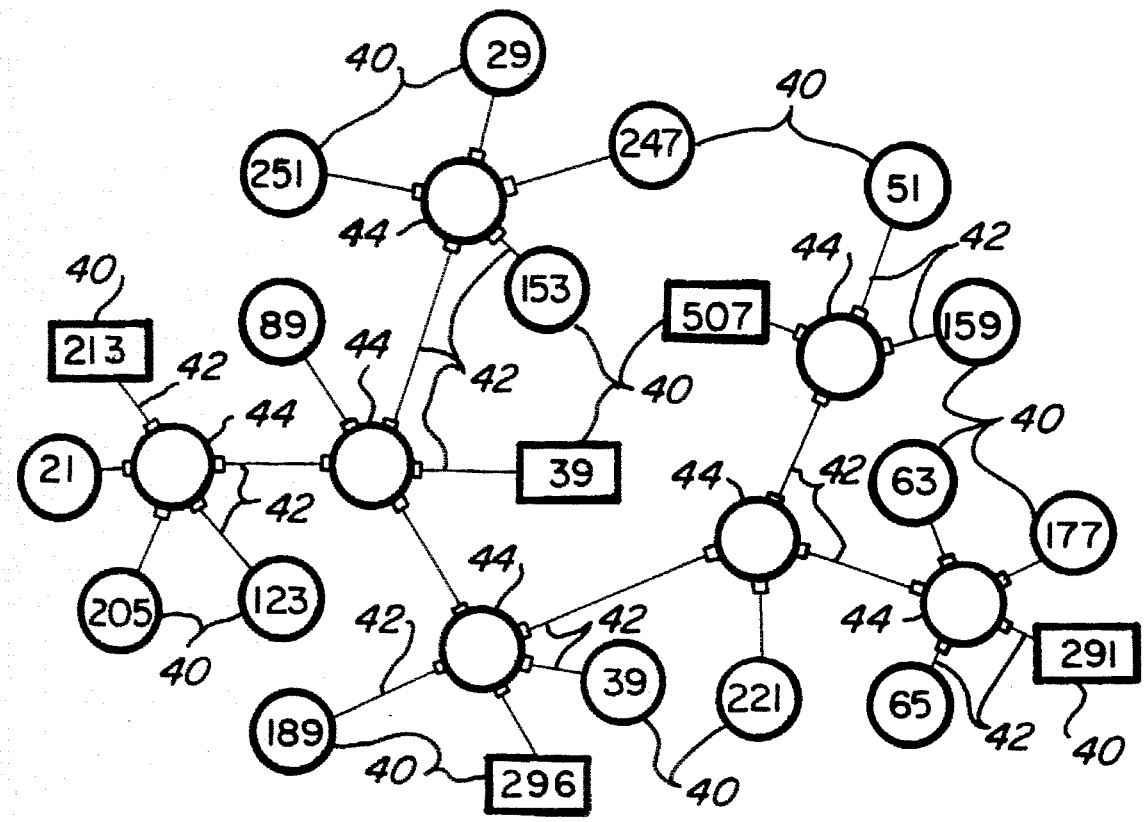
Fig_1
PRIOR ART
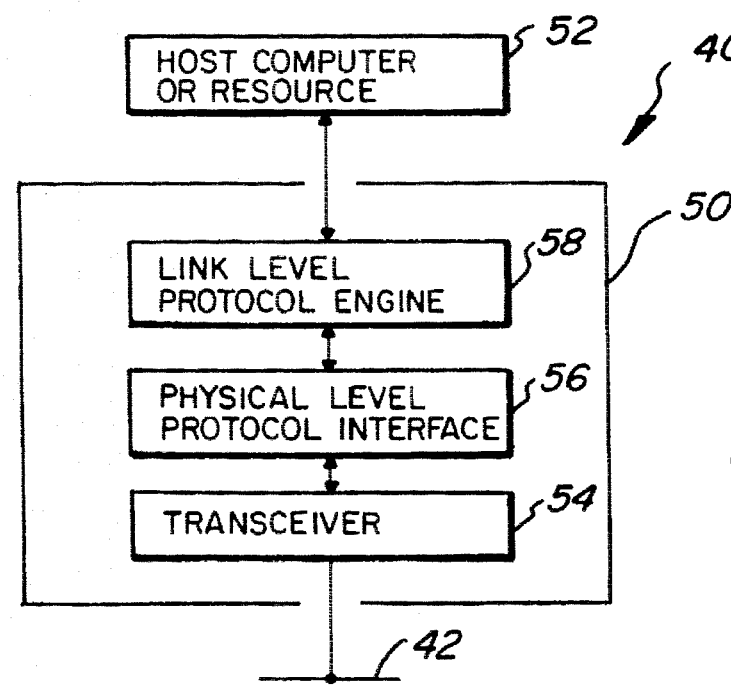
Fig_2
PRIOR ART

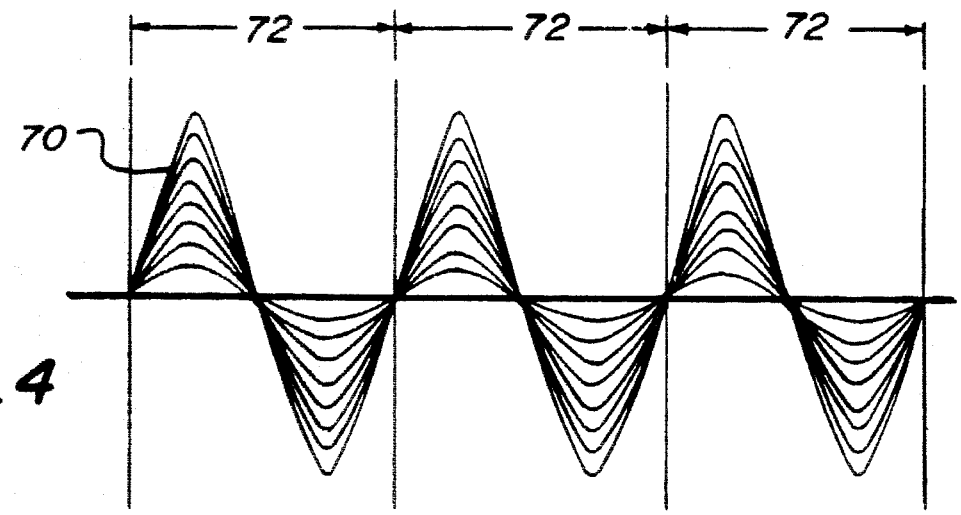
Fig_4
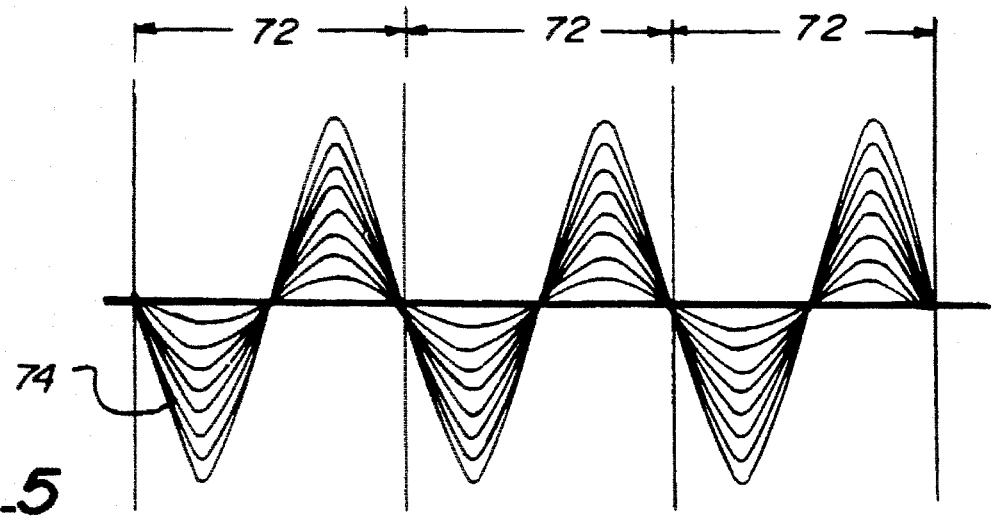
Fig_5

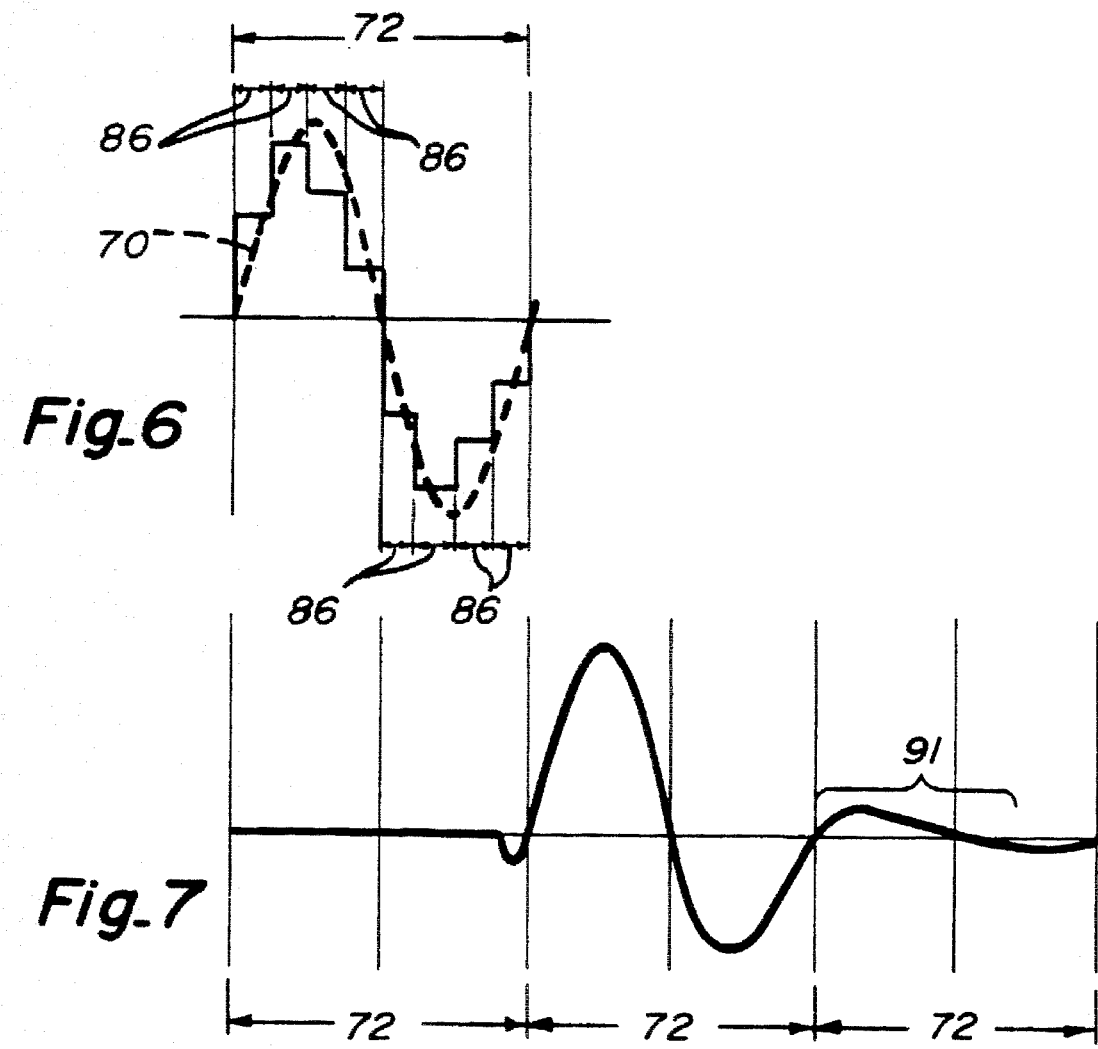
Fig. 6
Fig. 7
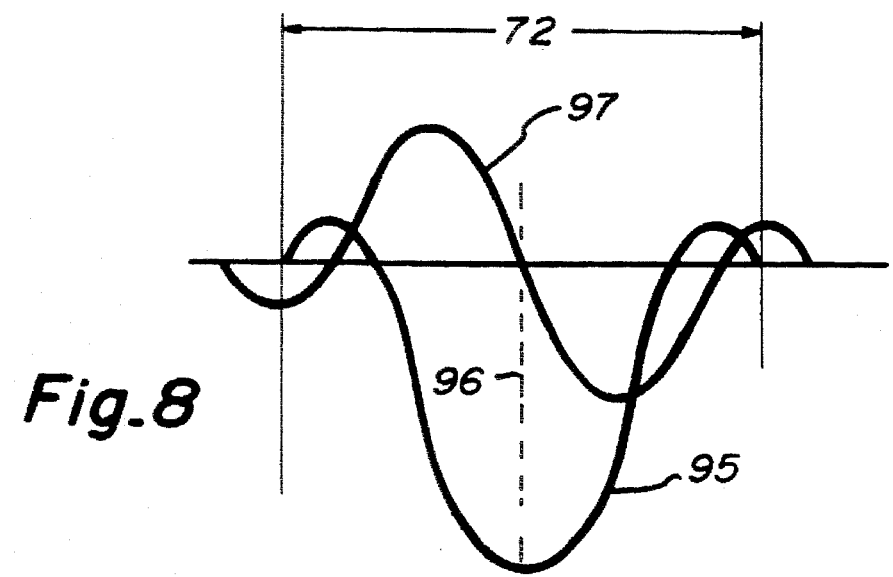
Fig. 8

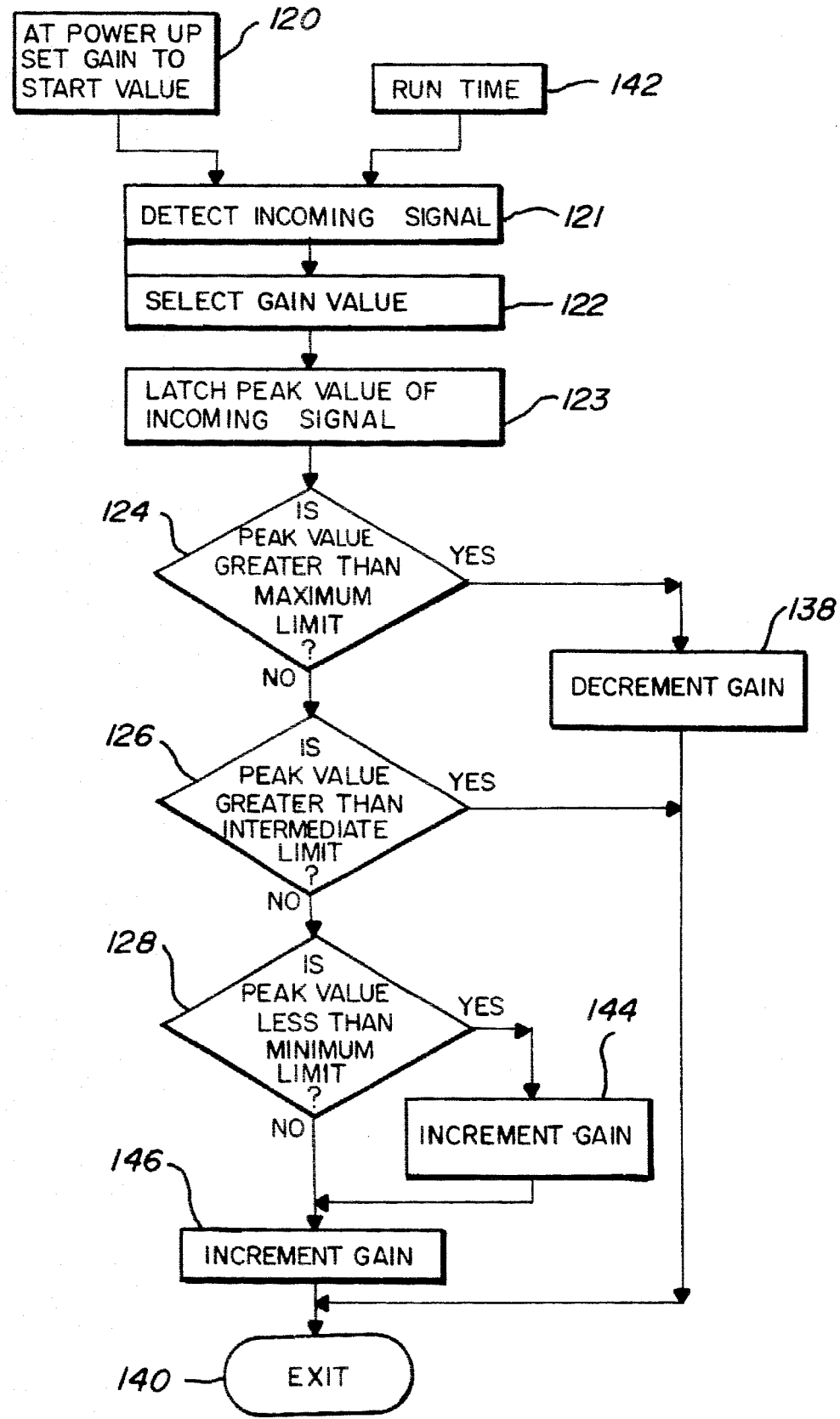
Fig_10

TECHNIQUE FOR CANCELLING COMMON MODE SWITCHING NOISE TO ACHIEVE REDUCED ERROR RATES IN A LOCAL AREA NETWORK

This invention pertains to local area networks (LANs) of the type in which an amplitude critical signal, such as an amplitude modulated signal, is conducted over a communication medium between nodes to convey information. More particularly, the present invention relates to a new and improved gain control and selection technique for maintaining an amplitude critical signal at effective detectable limits relative to inherent noise present on the medium, and also to a new and improved noise cancellation technique, both of which are employed to increase the reliability of communication by reducing errors which may occur when decoding the amplitude critical signal.

INCORPORATION OF RELATED SUBJECT MATTER

This invention is also related to the subject matter of U.S. Patents titled LAN WITH INTEROPERATIVE MULTIPLE OPERATIONAL CAPABILITIES, U.S. Pat. No. 5,008,879; LAN WITH DYNAMICALLY SELECTABLE MULTIPLE OPERATIONAL CAPABILITIES, U.S. Pat. No. 5,077,732; MULTIBIT AMPLITUDE AND PHASE MODULATION TRANSCEIVER FOR LAN, U.S. Pat. No. 5,050,189; DYNAMIC NETWORK RECONFIGURATION TECHNIQUE FOR DIRECTED-TOKEN EXPANDED-ADDRESS LAN, U.S. Pat. No. 5,048,014; and METASTABLE-FREE DIGITAL SYNCHRONIZER WITH LOW PHASE ERROR, U.S. Pat. No. 5,034,967; all of which are assigned to the assignee hereof. The disclosures of these U.S. Patents are incorporated herein by this reference.

BACKGROUND OF THE INVENTION

A LAN or local area network is one well known system for interconnecting a large number of computer-based resources to achieve selective communication between any or all of the resources. While LANs utilize a variety of different physical interconnection arrangements and even a greater variety of communication protocols, all LANs generally use a communication medium extending between nodes of the network. The communication medium is usually the physical cabling or conductors which connect all of the nodes and over which the signals are transmitted and received. The physical medium can also include radio communication links or optical links.

Each node includes a LAN interface which is connected to the communication medium and to the computer resource at the node. In general, the function of the LAN interface is to receive signals from the communication medium, extract the information conveyed by those signals, supply that information to the computer resource, and in addition to receive information supplied by the computer resource, encapsulate that information into specific signals known as frames which are recognized by the other LAN interfaces of other nodes of the network, and to transmit the frames over the medium. The functional rules which each LAN adaptor follows in encapsulating and extracting the information, and which control the transmission, receipt and other general communication functions between the LAN interfaces at each of the nodes is referred to generally as a network protocol.

The majority of LANs utilize digital signalling for communicating between LAN interfaces. Digital signals theoretically involve the presence or absence of a voltage at specific timing intervals. The presence of a voltage at a timing interval indicates a one bit of digital information while the absence of a voltage at a timing interval indicates a zero bit of digital information. In practicality, noise and other spurious electrical influences may exist on the medium, so the presence or absence of a voltage must be distinguished from the noise in order to achieve reliable communication.

Most LANs are also subject to certain specifications regarding the distance between nodes. Depending upon the characteristics of the communication medium, significant attenuation of the signals may result over relatively long links or segments of the communication medium. Medium connectors known as hubs are frequently employed to connect the various links of cables and optical or radio paths which form the communication medium. Hubs typically include an amplifier for amplifying a signal before passing it on to other links connected to the hub. The use of the hubs throughout the communication medium have thus served to amplify the levels of the signals communicated, and this amplification resisted the natural tendency for attenuation as the signal was transmitted throughout the medium to the nodes. Furthermore, the nature of a digital signal makes it relatively easy to amplify, because amplification will simply amplify the fact that a high one bit signal level is present, while the absence of amplification maintains or even reduces the level of the noise on the medium which might otherwise detract from the proper detection of a low zero bit signal level.

Recent developments in LANs have used amplitude critical signals as a means for enhanced signalling. For example, the first four U.S. Patents mentioned above describe a new type of LAN in which multiple bits of information may be conveyed by a single phase and amplitude modulated signal transmitted over the communication medium between LAN interfaces. In order to accurately communicate the correct set of multiple bits per signal element transmitted, it is necessary to accurately detect the level of the amplitude and phase modulated signal at specific timing intervals. Failure to accurately detect the amplitude of the phase and amplitude modulated signal at the critical time will result in erroneous communication.

Another example of amplitude critical signalling, although not as critical as phase and amplitude modulated signalling, is one which involves Manchester or a similar type of coding. With Manchester coding, a one bit of information is conveyed by an abrupt signal transition within a specific timing interval, while a zero bit of information is communicated by the absence of such a transmission during a specific timing interval.

Manchester and similar coding have recently been employed to reduce radiated electromagnetic emissions from the LAN communication medium. Electromagnetic emissions occur at very high signalling frequencies, for example 50 megahertz and higher. By using Manchester or similar coding for conveying information, and by establishing multiple signal levels at which the transitions to different amplitudes may occur, the effective signalling frequency is reduced. A reduction in the effective signalling frequency reduces the amount of radiated electromagnetic radiation. For example, if the full range available for analog communications over the medium is divided into two divisions, a transition from the low level to an intermediate level would indicate a one bit, and a transition from the intermediate level to the upper level would also indicate another one bit. Arranged in this manner, the maximum radiation frequency from signals conducted over the medium would be no greater than one-fourth of the maximum transition frequency. Reduction in the radiated electromagnetic radiation by reduction in the signalling frequency is important for various health reasons and may be regulated by certain governmental agencies. However to obtain the advantage of reduced electromagnetic radiation with a Manchester or similar signalling technique, amplitude critical signals must be reliably established and maintained.

The difficulties in maintaining adequate signals in an amplitude critical signalling LAN protocol are considerably greater than those associated with maintaining signal integrity in purely digital signalling protocol. For example, the inherent attenuation created by passage of the signals through any communication medium will result in amplitude reduction of the signal at a receiver compared to the amplitude at the transmitter. However in digital signalling protocols, amplification is a relatively simple task, since any signal level greater than approximately one-half of a full range signal will be interpreted as a one bit while any signal less than approximately one-half of the full range signal will be interpreted as a zero bit. In amplitude critical signalling protocols, the amplification and decoding must be more precise.

The problems of maintaining amplitude critical signals on LANs of the type described in the above identified patents is illustrated by the characteristics of the signals. The signals can occupy any one of eight positive levels or eight negative levels. The negative level signals are actually phase shifted versions of the positive level signals. Each signal level represents a unique four bit digital signal pattern. An analog to digital converter present at each interface decodes the amplitude of the incoming signal into one of the 16 four bit patterns. It can be appreciated that if the analog level of the signal is adversely influenced from noise, other spurious signals or attenuation, for example, it may be decoded into a four bit pattern different from that which originated the signal. As a consequence, bit errors may be much more likely due to noise and attenuation. Excessive amplification may also be a problem. Too much amplification will boost the upper signal level, thereby distorting the signal and causing it to be decoded into an incorrect four bit pattern. Further still, the low level signals represented by amplitudes in the lower range must be distinguishable from the inherent noise present on the communication medium. If the amplitude of a signal falls to a sufficiently low level where the magnitude of the noise is significant relative to the magnitude of the signal, the noise has a much greater possibility of distorting the signal amplitude, again causing erroneous decoding.

As another example of the necessity to maintain the appropriate magnitude of a multilevel Manchester coded amplitude critical signal, any excessive signal amplification may cause the signals to reach the maximum level where a transition would not be distinguishable, thereby destroying the information revealed by the transitions and confusing an intended transition with an unchanged signal level.

The problems of maintaining the signal level in amplitude critical signals are compounded when the LAN signalling protocol uses a minimum of signals to encapsulate the information conveyed. For example, some types of LANs use relatively long preambles in the frame. The preamble signals constitute overhead, because they are not useful in conveying information but are only useful in achieving the intended functionality of the LAN interfaces in accordance with the network protocol. Thus, many LAN protocols attempt to increase information throughput by reducing the number of extraneous signals in each frame necessary to achieve LAN protocol functionality. Relatively lengthy preambles allow automatic gain circuits to become operative, because the length of the preamble allows an automatic gain circuit enough time to adjust to achieve a desired degree of amplification. However, relatively short preambles do not provide an adequate opportunity for automatic gain circuits to achieve adequate amplification.

Gain adjustment is even more difficult in LANs whose communication protocol involves half duplex signalling. Half duplex signalling refers to a single message transmission in a single direction or route on the LAN medium. After the one message transmission has been completed, another or a reply message is usually transmitted back in the opposite direction. Because of the singular direction and the singular occurrence of the messages, and because the messages can extend between nodes which are separated by variable and different distances over medium links having different amounts of attenuation, it is very difficult to quickly achieve the necessary gain adjustments to maintain amplitude critical signals at desired levels.

It is with respect to these problems and other problems that the present invention has evolved.

SUMMARY OF THE INVENTION

The present invention relates to improvements in a local area network (LAN) of the type using amplitude critical signals for conveying information between nodes which are operatively connected by a communication medium. Each node has a transmitter to create and transmit the amplitude critical signals over the medium, and each node also has a receiver to receive and decode the amplitude critical signals into digital information which is directly related to the amplitude level of the received amplitude critical signal. Each receiver further determines a calibration value from the amplitude level of a predetermined calibration amplitude critical signal. Each receiver includes a receiver amplifier for amplifying received amplitude critical signals. The LAN may further include at least one hub having a plurality of ports to connect to separate portions of the medium. Each hub operatively receives an incoming amplitude critical signal at one port and to transmits the received signal at other ports, and to do so each port includes a receiver and a transmitter.

One important feature of the present invention relates to accurately controlling the signal magnitude or level of the amplitude critical signals communicated over the medium for the purpose of maintaining the integrity of the information conveyed without distortion due to excessive amplification or from the effects of noise inherently present on the medium. Another important feature relates to maintaining a relatively high signal to noise ratio of the amplitude critical signals. Another important feature relates to increasing the relative distance between spacially separated nodes over which amplitude critical signals convey information. A further important feature relates to reducing the number of errors which may occur in decoding amplitude critical signals. Yet another feature relates to cancelling the effects of certain types of noise and spurious signals which might adversely influence the integrity of LAN communications. Another feature relates to rapidly adjusting the gain of a variable gain amplifier in a LAN interface or hub in response to the receipt and interpretation of a relatively small number of signals, thereby minimizing the overhead necessary to achieve adequate amplification.

In accordance with these and other features, one aspect of the present invention relates to an improved gain control and selection circuit of each receiver of a LAN interface or hub in a LAN. An evaluation circuit compares the calibration value to a predetermined maximum limit and to a predetermined minimum limit and supplies a control signal related to the relationship of the calibration value with respect to the maximum and minimum limits. A gain select circuit is connected to the receiver amplifier and receptive of the control signal. The gain select circuit includes a plurality of gain control elements and at least one switch responsive to the control signal to selectively connect at least one gain control element to the receiver amplifier to selectively establish at least a first and a second predetermined level of amplification by the receiver amplifier for the received amplitude critical signals. The first amplification level is approximately unity, and the second amplification level is greater than the first amplification level. The switch responds to the control signal to connect the gain control elements to the receiver amplifier to establish the first amplification level when the calibration value is greater than or equal to the maximum limit. The switch also responds to the control signal to connect the gain control elements to the receiver amplifier to establish the second amplification level when the calibration value is less than or equal to the minimum limit. Preferably the evaluation circuit also compares the calibration value to a predetermined intermediate limit located between the minimum and maximum limits and supplies the control signal related to the relationship of the calibration value with respect to the minimum, intermediate and maximum limits. The gain select circuit further selectively establishes a third and a fourth predetermined additional amplification levels. The third amplification level is greater than the first and less than the second amplification level, and the fourth amplification level is greater than the first and less than the third amplification level. The switch responds to the control signal to connect the gain control elements and the receiver amplifier to establish the third amplification level when the calibration value is greater than the minimum limit and less than or equal to the intermediate limit. The switch also responds to the control signal to connect the gain control elements and the receiver amplifier to establish the fourth amplification level when the calibration value is greater than the intermediate limit and less than the maximum limit.

Another feature of the present invention involves method of reducing errors when decoding amplitude critical signals into the digital information. The method includes setting maximum and minimum, and preferably intermediate, limits for the amplitude of the received signal. First, second, and preferably third and fourth levels of amplification are established. The first level is approximately unity, the second level is the greatest, and the third and fourth levels decrease in magnitude between the second and first levels. The calibration value is compared to the limits and the received signal is amplified by a different amplification level depending upon the magnitude of the received signal relative to the limits.

In accordance with the above and other features, one aspect of the present invention also relates to an improved noise cancellation circuit within at least one hub. The noise cancellation circuit includes a first and second receiver amplifier of the receiver at each port and a first and second gain select circuit is respectively connected to each first and second receiver amplifier at each port. A first circuit device is connected to the medium to receive the amplitude critical signals and to supply a primary copy and an inverted copy of the received amplitude critical signal at each port. The first gain select circuit and the first receiver amplifier at each port respond to the primary copy signal and selectively establish a level of amplification at the first receiver amplifier for the primary copy signal. The second gain select circuit and the second receiver amplifier at each port respond to the inverted copy signal and selectively establish a level of amplification at the second receiver amplifier for the inverted copy signal. The first and second gain select circuits preferably establish the same level of amplification. A second circuit device is connected to the first and second amplifier receivers to create an inverted version of one of the primary copy signal or the inverted copy signal and to add the inverted version to the other one of the primary copy signal or the inverted copy signal which was not inverted. The addition produces an amplified version of the received amplitude critical signal, and also cancels any noise which equally affects the primary and inverted copy signals by the subtraction of the noise which occurs when the inverted version and the other one of the primary and inverted copy signals is added.

Another interrelated feature of the present invention involves a method of reducing errors when decoding amplitude critical signals into the digital information by cancelling the affect of noise. The method includes creating a primary copy signal and an inverted copy signal of the amplitude critical signal received at each port. The primary and inverted copy signals are both amplified preferably by the same predetermined amplification level. An inverted version signal is created by inverting one of the amplified primary copy signal or the amplified inverted copy signal. The inverted version signal is added to the other one of the amplified primary copy signal or the amplified inverted copy signal to produce an amplified version of the incoming signal. The noise is cancelled from the amplified version of the incoming signal by adding the signals which effectively subtracts the effects of the noise.

A more complete appreciation of the present invention and its scope can be obtained from understanding the accompanying drawings, which are briefly summarized below, the following detailed description of a presently preferred embodiment of the invention, and the appended claims.

BRIEF DESCRIPTION OF THE DRAWINGS

FIG. 1 is an illustration of a prior art bus-type LAN in which the present invention is incorporated, having a network medium connecting multiple nodes, including basic nodes and enhanced nodes.

FIG. 2 is a generalized block diagram of an interface of a basic or enhanced node of the LAN shown in FIG. 1.

FIG. 4 is a generalized illustration of multiple, different-amplitude, sine pulse waveforms which commence with a positive half cycle and which end with a negative half cycle, which are transmitted and received by the transceiver shown in FIG. 3.

FIG. 5 is a generalized illustration of multiple, different-amplitude, sine pulse waveforms which commence with a negative half cycle and end with a positive half cycle, which are also transmitted and received by the transceiver shown in FIG. 3, and which are illustrated on the same time reference axis as that shown in FIG. 4.

FIG. 6 is an illustration of the simulation of one waveform shown in FIG. 4 in eight segments or steps and the smoothing effect on the simulation (shown by dashed lines) achieved by a transmit filter of the transceiver shown in FIG. 3.

FIG. 7 is a representation of an actual sine pulse waveform or "dipulse" which is transmitted and received by the transceiver shown in FIG. 3.

FIG. 8 illustrates a primary signal waveform and its negative derivative impulse signal waveform supplied by a matched filter of the transceiver shown in FIG. 3, in response to the reception of a sine pulse shown in FIG. 7. The primary and derivative impulse waveforms are shown on a common time axis which is expanded relative to the time axis shown in FIG. 7.

FIG. 10 is a flow chart of functions achieved by a network protocol controller of a transceiver shown in FIGS. 3 and 9 or of a controller of a hub shown in FIG. 1, for achieving the selective and variable gain control of the present invention.

DETAILED DESCRIPTION

Figure 3:
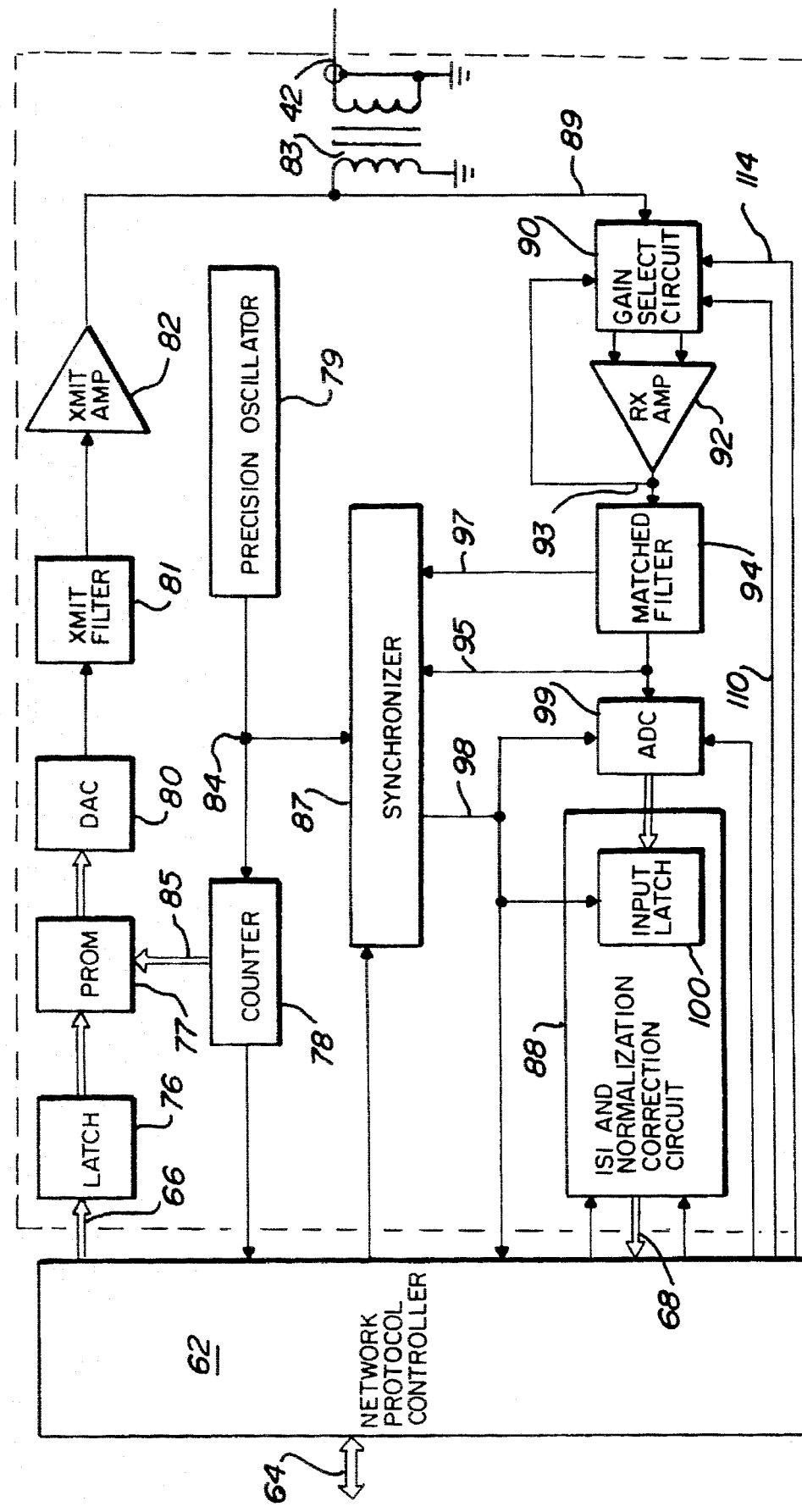
FIG. 3 is a block diagram of an interface shown in FIG. 2, including a transceiver which incorporates the present invention.

The present invention applies to a local area network (LAN or "network") such as that shown in FIG. 1. The LAN comprises a plurality of nodes 40 which are all commonly interconnected to a communication medium 42. The communication medium 42 includes means by which signals are transmitted between the nodes 40. The communication medium may take the form of a plurality of interconnected signal communication links, such as coaxial cables, twisted cable pairs, optical links, radio links, or combinations of these and others.

The LAN illustrated in FIG. 1 is a bus-type LAN, meaning that all of the nodes 40 are connected to a single logical point (the medium 42) and logically in parallel with one another. An essential characteristic of a bus-type LAN is that each transmission by any node is directly received by all of the other nodes. Each node of a bus-type LAN may directly address and communicate with other nodes through the medium 42.

Typically, the nodes are connected through connecting point devices known as hubs 44. A hub 44 is a means by which a plurality of signal communication links can be connected together, thus connecting all the communication links as portions of the medium 42. Hubs facilitate cable management, signal amplification and/or fault isolation.

Each node 40 of the LAN has its own unique network address, known as an identification (ID). This address or ID is established for the node at the time the node is physically connected to the LAN medium 42 or when the node becomes active on the medium 42, or in some other well known manner. The numbers enclosed within the circles and the boxes in the nodes 40 shown in FIG. 1 are representative examples of network addresses.

The nodes 40 communicate with each other by transmitting "frames" of data. Each frame typically include the address of the node to which the frame is destined, referred to as a DID. The node which initiates the communication is referred to as a "source" node. The node to which the communication is destined is referred to as a "destination" node. Since all of the other nodes on the LAN also receive the signals transmitted by the source node, the DID is utilized by each node to recognize and accept only those transmissions addressed to it, while discarding or not recognizing the other transmissions not addressed to it. In addition, since some communications involve multiple transmissions between the source and destination nodes, the source node also frequently includes its own address (SID) in transmissions so the destination node can utilize that address when replying. Broadcasts, which are received by all nodes, and multicasts which are received by predefined groups of nodes, are also made possible by this addressing technique.

Two different types of nodes 40 are present on the LAN shown in FIG. 1. Basic nodes are shown with circles indicating the basic node 40, and enhanced nodes are shown with boxes indicating the enhanced node 40. Both basic and enhanced nodes are connected to the same medium 42. The basic nodes have only a single basic or common operational capability, and therefore always operate in accordance with this common operational capability. The enhanced nodes have multiple different operational capabilities. One of the multiple operational capabilities available from each enhanced node is the common operational capability also present in each basic node. Thus, both the enhanced and the basic nodes have one common operational capability which may be used for communication. Examples of basic and enhanced nodes, multiple different operational capabilities, different communication protocols, and different data transfer rates between the nodes, are discussed in greater detail in the first four above referenced U.S. Patents of the assignee.

Each node includes an interface 50 by which signals are applied to and received from the medium 42, as is shown in FIG. 2. The general nature of an interface for both enhanced and basic nodes is similar. Each node 40 also includes a host processor, controller, computer or other resource 52 which performs various data processing and transfer functions. For example, a node may include a personal computer, work station, a network server computer, or network connected I/O device, interface, sensor or actuator, or the like, which transmits and receives data over the medium 42.

The function of the interface 50 is to send the data over the medium, to receive the data from the medium, to receive the data to be sent on the medium from the host processor, and to apply the data received from the medium to the host processor, so that the host processor can function in an efficient and reliable manner. Because each node includes an interface 50, the functionality of the interfaces is preferably distributed throughout all of the nodes of the LAN.

The basic components of a typical interface 50 are illustrated in FIG. 2. A transceiver 54 applies the electrical, optical or other physical signals to the medium 42 and receives similar signals from the medium 42. A physical level protocol interface 56 receives electrical signals from the transceiver 54 and applies electrical signals to the transceiver 54. The signals transmitted on the medium 42 are in serial form. One of the functions of the physical level protocol interface 56 is to convert the serial data stream into a parallel data stream for use by the other elements of the node, and to convert the parallel data stream from the other elements of the node into a serial data stream. The term "physical level" used in reference to the interface 56 is the well known physical layer in the seven layer reference model for network communications. The physical level or layer is responsible for interfacing with the medium 42, detecting and generating signals on the medium, and converting and processing the signals received from the medium. In very general terms, the physical layer concerns the general encoding of network data into waveforms which will travel on the medium, and decoding those waveforms when received. The physical level protocol interface 56 and the transceiver 54 achieve these functions.

Each interface 50 also includes a link level protocol engine 58. "Link level" again refers to the standard seven layer reference model for networks, and generally relates to sending and receiving frames over the medium 42 and controlling access to the medium 42. Frames relate to groupings of various physical level signals in such a way to achieve the desired network protocol functionality. For example, all the functions involved in sending and receiving frames, including inserting starting delimiters, ending delimiters, and stripping these off once the data is received, are link level functions. Other link level functions are access control to the medium and the handling of affirmative and negative acknowledgements. The link level protocol engine 58 controls and executes the reconfiguration sequence to allow newly operative nodes to join the communications and to allow newly inoperative nodes to withdraw from communications. Alternatively, many of the link level functions could also be achieved by the host computer or resource 52. The higher levels of communication in the seven layer model are generally handled by the host computer or resource 52 of the node. Even though it is preferred to implement the functionality of the interfaces in a distributed manner in each node, some of this functionality, for example media access control, can be implemented on a centralized basis, as is known.

One well known, token-passing, bus-type LAN which was developed by the assignee hereof has been manufactured and sold under its United States registered trademark ARCNET. An extensive amount of information has been published on the ARCNET LAN, both by the assignee of the present invention and by others. Components to implement the ARCNET LAN are commercially available from sources including the assignee and others. One source of information concerning the ARCNET LAN is the *ARCNET Designer's Handbook* published by Datapoint Corporation, San Antonio, Tex., copyright 1983. The basic aspects of the preferred embodiment described herein are those of the ARCNET LAN, although the present invention has applicability to LANs other than the ARCNET LAN.

More details pertaining to the enhanced aspects of the LAN, including the communication protocol used to communicate frames between nodes 40 and the functionality of the nodes in achieving both normal and enhanced communication capability are described in the above mentioned U.S. Patents.

To explain the aspects of the present invention, some of the enhanced, amplitude-critical signalling features of the assignee's LAN are described below. Although the features of the present invention are advantageously employed conjunction with the LAN developed by the assignee, the present invention may be applied to other types of networks in which amplitude-critical signals are employed to communicate information.

An example of an interface 50 using an improved transceiver 60 which incorporates the improvements of the present invention is shown in FIG. 3. The transceiver 60 is connected between a network protocol controller 62 and a network communication medium element 42. The network protocol controller 62 performs the functions of the physical level protocol interface 56 and some or all of the functions of the link level protocol engine 58 (FIG. 2).

The network protocol controller 62 operatively receives data at 64 from the computer or resource 52 (FIG. 2), reorders or otherwise modifies that data in accordance with the predetermined LAN communication protocol, and applies that data as a multiple-bit, digital input value or signal over an input data path 66 to the transceiver 60. The digital input value at 66 is a four-bit digital data signal in this example.

A transmitter of the transceiver 60 receives each digital input value 66 from the network protocol controller 62, converts the bit pattern of the digital input value into one of the amplitude and phase modulated sine pulses shown in FIGS. 4 and 5, and transmits the sine pulse over the medium element 42. A receiver of the transceiver 60 receives the sine pulses (FIGS. 4 and 5) from the medium element 42, and decodes the amplitude and phase information from the sine pulse to create a four-bit digital value which corresponds to the original predetermined bit pattern supplied to the transmitter of the source node. The four-bit digital value created by the receiver of the transceiver 60 is supplied in an output data path 68 to the network protocol controller 62.

In addition to decoding the phase and amplitude modulated analog signals and creating four-bit digital values from the analog signals, the receiver also normalizes to the analog signal amplitude, corrects for signal distortion created by the preceding signal and by the medium 42 (known as inter symbol interference "ISI"), and effectively synchronizes its operation to the incoming stream of amplitude critical signals from the medium 42, as is completely described in the above mentioned U.S. Pat. No. 5,050,189.

The various types of amplitude and phase modulated sine pulse signal waveforms transmitted to and received from the medium 42 by the transceiver 60 are shown in FIGS. 4 and 5. FIG. 4 illustrates a series of waveforms 70 which are applied during consecutive equal length time intervals 72. FIG. 5 illustrates a series of waveforms 74 applied during the intervals 72 which are phase inversions of the waveforms 70 illustrated in FIG. 4. The waveforms 70 and 74 are illustrated as pure sine waves. In reality the signals applied to the network medium are more in the nature of a sine pulse or dipulse (one of which is more accurately shown in FIG. 7), wherein the leading half cycle is similar to a half cycle of a sine wave, but the following half cycle is attenuated somewhat compared to the preceding sine wave half cycle.

The sine pulses are each modulated into eight discrete amplitude levels as shown by the waveforms 70 and 74. Since the transceiver 60 can transmit and receive any of the waveforms 70 and 74, eight different signal amplitude levels at each of two different phases are available for conveying 16 different data values. The 16 distinct signals or signal states encode all 16 possible binary code bit values or patterns from 0000 to 1111.

Each of the discrete waveforms 70 and 74 represents a separate symbol. Each symbol encodes a unique four bit pattern of data, and each symbol therefore represents one four bit digital value. The transceiver 60 is thus capable of transmitting and receiving four bits per signal element, each signal element being one of the symbols shown by the waveforms 70 or 74. The absence of a waveform 70 or 74 is a silence symbol or interval 72 of silence.

By utilizing phase modulation as well as amplitude modulation, a greater difference or gradation between adjacent amplitude levels of the waveforms 70 and 74 is available, for a given peak-to-peak maximum amplitude. This improves the ability of the receiver to discriminate between each of the 16 symbols. If phase modulation was not employed, the 16 different amplitude levels would have to be separated by a much smaller gradation, assuming a constant maximum amplitude signal. Without using phase modulation, reliable discrimination of the amplitude levels would be much more difficult or impossible. Additional phase relationships can be utilized in cases where more than four bits are encoded by each symbol.

The transmitter of the transceiver 60, shown in FIG. 3, includes a latch 76, a programmable read only memory (PROM) 77, a counter 78, a high speed precision oscillator 79, a digital to analog converter (DAC) 80, a transmit filter 81, a transmit amplifier 82, and a transformer 83. The latch 76 holds the four-bit digital input value supplied at 66 by the network protocol controller 62. The primary purpose of the latch 66 is to establish the proper timing between the data presented by the controller 62 and the use of that data by the transmitter of the transceiver 60.

The four-bit data value from the latch 76 is applied to the high order input addresses of the PROM 77. A reference clock signal supplied at 84 from the oscillator 79 is applied to the counter 78. The frequency of the reference clock signal at 84 is a multiple of the communication frequency of the transceiver. The communication frequency is established by the intervals 72 (FIGS. 4 and 5). For example, the transceiver 60 may communicate symbols at 5 megahertz, and the reference clock signal from the oscillator 79 may occur at 40 megahertz.

In response to the reference clock signal at 84, the counter 78 generates an interval reference signal at 85 once each interval 72. The interval reference signal 85 occurs at the frequency of the transmitted and received signals, and is also applied to the protocol controller 62. The counter 78 also generates binary count signals at 85. The count signals at 85 are applied to the low order input addresses of the PROM 77.

The four-bit data pattern from the latch 76 specifies one of the 16 waveforms 70 and 74 (FIGS. 4 and 5). Each of the waveforms 70 and 74 has recorded in the PROM 77 eight values which represent the maximum magnitudes of each segment 86 or time division of the waveforms 70 and 74, as illustrated in FIG. 6. The bit pattern of the digital input value concatenated with the count signal 85 from the counter 78 forms addresses in the PROM 77 for the digital value of the amplitudes of the eight separate segments 86 which define each waveform 70 or 74. The count signals at 85 sequence the PROM 77 through each of these eight values at the rate of the reference clock signal 84, causing the PROM 77 to apply eight different digital data values to the DAC 80 for each bit pattern value applied by the latch 76. The output signal from the DAC 80 is thus a step segmented simulation of one of the waveforms 70 or 74, as is shown by the solid lines in FIG. 6. The functionality of the counter 78, PROM 77 and latch 76 may be implemented also in programmable array logic.

Each of the eight digital values from the PROM 77 is rapidly converted by the DAC 80 into an analog signal. In some cases, less than eight steps per waveform will suffice. The transmit filter 81 smoothes out the steps and creates the sine pulse waveform 70 shown by dashed lines in FIG. 6. The sine pulse represented by this waveform 70 is defined by the four bit digital input value. The transmit amplifier 82 amplifies the signal from the transmit filter 81 and supplies it to the primary winding of the transformer 83. The transformer 83 induces the sine pulse onto the medium 42. Of course, if the medium 42 is something other than an electrical cable (coaxial cable or twisted pair cable) as is illustrated, a known piece of appropriate equipment is substituted for the transformer 83.

When transmitting data, the network protocol controller 62 periodically inserts intervals of silence and calibration pulses in the stream of transmitted symbols. The periodicity at which calibration pulses are inserted within the network transmission frames is determined by the LAN communication protocol. The functionality of the network protocol controller 62 and the insertion of the calibration pulses have been described more completely in the U.S. Patents of the assignee mentioned above.

One calibration pulse is shown in FIG. 7. Each calibration pulse is created from a full amplitude sine pulse waveform 70 (FIG. 4) commencing with a positive half cycle and ending with a negative half cycle. Each calibration pulse is preceded and followed by an interval 72 of silence.

The calibration pulses are analyzed by a synchronizer 87 to synchronize the phase of the sampling points of the receiver relative to the phase of the received sine pulses. The calibration pulses also establish a basis for eliminating the effects of ISI distortion created by the preceding signal and by the LAN medium itself (ISI is shown at 91 in FIG. 7) and to adjust or normalize the gain of the receiver of the transceiver 60 to eliminate the relative effects of network amplification or attenuation, thereby allowing the different amplitudes of the received sine pulses to be accurately decoded into the four-bit value which each individual symbol represents. The effects of ISI are eliminated and the normalizing function is achieved by an ISI and normalization correction circuit 88. Specific details concerning the nature and operation of the synchronizer 87 and the ISI and normalization correction circuit 88 are described in the above mentioned U.S. Pat. Nos. 5,050,189 and 5,034,967.

The receiver portion of the transceiver 60 shown in FIG. 3 comprises, in addition to the synchronizer 87 and the ISI and normalization correction circuit 88, the transformer 83, a gain select circuit 90, a receiver amplifier 92, a matched filter 94, and an analog to digital converter (ADC). In response to the received sine pulses 42, the transformer 83 induces a received signal at 89 which relates to the amplitude and phase at an input terminal of the gain select circuit 90. The received signal at 89 relates to the amplitude and phase of the sine pulse received at 42. The gain select circuit 90 adjusts the level of amplification achieved by the receiver amplifier 92, to advantageously amplify the received signal at 89 as an amplified received signal at 93. The amplified received signal 93 is applied to a filter, preferably a time-domain filter such as the matched filter 94. The matched filter 94 responds to the amplified received signal at 93 by producing an impulse waveform 95 as shown in FIG. 8. The peak maximum energy of the impulse waveform 95 occurs at time 96 as shown in FIG. 8, and this peak directly relates to amplitude of the amplified received signal 93.

The matched filter 94 also rejects signals other than those having the time-domain characteristics of communicating frequency sine pulses. Time-domain filtering is important in the ability to distinguish low-level amplitude modulated sine pulses from noise on the communication medium. The magnitude of low-level sine pulses may be comparable to the magnitude of noise and other spurious signals. Time-domain filtering rejects the noise because the random time characteristics of the noise are not correlated to the impulse response characteristics of the time-domain matched filter 94. However, the characteristics of the low-level sine pulses do correlate with the impulse response characteristics of the time domain filter means and those signals are passed as primary impulse signals 95 which represent symbols. Each different primary impulse signal is distinguished by its amplitude, and the amplitude of each primary impulse signal is directly related to the amplitude of the sine pulse.

Output signals from the matched filter 94 include the impulse signal at 95, which represents a symbol, and a derivative signal at 97, also shown in FIG. 8. The derivative signal 97 is the mathematical derivative of the impulse signal 95. The impulse signal 95 inherently achieves its maximum value when the derivative waveform 97 crosses through a zero value, which occurs at time 96 shown in FIG. 8.

The impulse signal 95 and the derivative signal 97 are applied to the synchronizer 87, and the synchronizer 87 derives and supplies a sampling control signal at 98 which occurs relative to the maximum amplitude center point 96 (FIG. 8) in time width of the primary impulse waveform 95. The sample control signal 98 from the synchronizer 87 is applied to the analog to digital converter (ADC) 99, to an input latch 100 of the ISI and normalization correction circuit 88, and to the protocol controller 62 so their operation may be synchronized with the presentation of the decoded digital output values at 68.

The ADC 99 converts the analog value of the primary impulse signal 95 (FIG. 8) from the matched filter 94 to a digital value upon the application of the sample control signal 98. The input latch 100 accepts and latches the digital value supplied by the ADC 99 upon the assertion of the sample control signal 98. After latching the digital value, that latched value is made available by the input latch 100 for use by the correction circuit 88 to normalize its value and to correct for ISI, among other things. Once the digital value has been corrected in the circuit 88, the corrected value is supplied at 68 to the network protocol controller 62 for use in accordance with the LAN communication protocol.

The gain select circuit 90 embodies some of the improvements of the present invention. The gain select circuit 90 amplifies the signal at 89 to a predetermined extent so it approaches the maximum signal level allowable for that signal 89, thereby reducing errors in decoding and maintaining a relatively high signal-to-noise ratio of the amplitude critical received signals 89.

Figure 9:
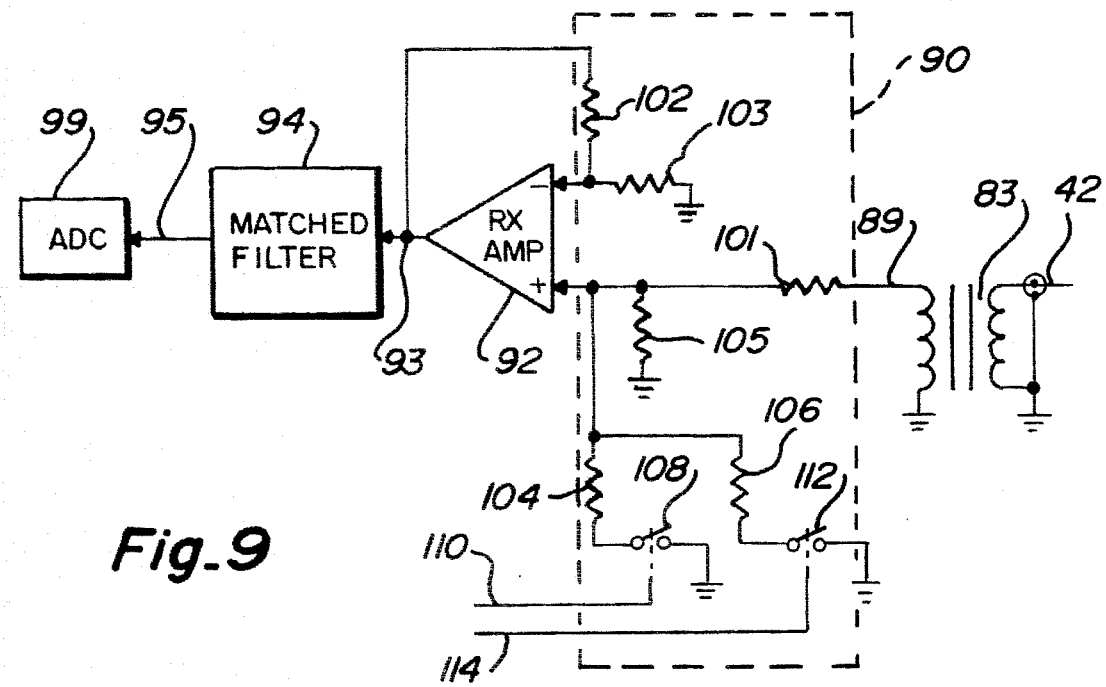
FIG. 9 is a schematic and block diagram of a portion of the transceiver shown in FIG. 3, illustrating a selectable and controlled gain amplification circuit which embodies aspects of the present invention.

Details of the gain select circuit 90 are shown in FIG. 9. The LAN medium 42 is connected to the primary winding of the transformer 83. The secondary winding of the transformer 83 applies the received signal 89 to the gain select circuit 90, through an input resistor 101 to a positive input terminal of the receiver amplifier 92. Another resistor 105 is connected between the positive input terminal of the receiver amplifier 92 and reference potential. In addition, two gain control resistors 104 and 106 are selectively connected between the positive input terminal of the receiver amplifier 92 and reference potential. The resistor 104 is selectively connected to reference potential by closing a conventional analog switch 108. The open and closed condition of the switch 108 is controlled by a signal applied at 110 from the network protocol controller 62 (FIG. 3). The gain control resistor 106 is connected to reference potential by closing an analog switch 112. The open and closed condition of the switch 112 is controlled by a signal applied at 114 from the network protocol controller 62.

The gain select circuit 90 includes a feedback resistor 102 which is connected between the output terminal of the receiver amplifier 92 and the negative input terminal of the receiver amplifier 92. Another resistor 103 is connected between the negative input terminal of the receiver amplifier 92 and reference potential.

The signals at 110 and 114 cause the analog switches 108 and 112 to selectively open and close. With analog switch 108 closed and analog switch 112 open, the gain of the receiver amplifier 92 is established by the mathematical relationship of the voltage divider formed by resistance 101 and the parallel combination of resistances 104 and 105. Alternatively, with analog switch 112 closed and analog switch 108 open, the gain of the receiver amplifier 92 is established by the mathematical relationship of the voltage divider formed by resistance 101 and the parallel combination of resistances 105 and 106. When both analog switches 108 and 112 are closed, the gain of the receiver amplifier 92 is established by the mathematical relationship of the voltage divider formed by resistance 101 and the parallel combination of resistances 104, 105 and 106. When both analog switches 108 and 112 are open, the gain of the receiver amplifier 92 is established by the voltage divider formed by resistance 101 and resistance 105.

In this manner, four different gain levels of amplification are achieved by the open and closed states of the two switches 108 and 112. Furthermore, by specific selection of the values of the resistors 102, 103, 104, 105 and 106, it is possible to achieve multiple specific gain increments of amplification spaced at advantageous increments. For example, values of resistance for the resistors 102, 103, 104, 105 and 106 at 365 ohms, 68 ohms, 40 ohms, 140 ohms and 130 ohms, provide gain levels of 1, 1.18, 2 and 3 from the receiver amplifier 92, respectively. Unity gain amplification is necessary in the circumstance that the received signal is already at a value near its maximum value, to avoid over-amplifying the signal.

The level of gain actually established by the signals 110 and 114 depends on the magnitude of the calibration pulse, compared to the maximum level of signal strength allowed to avoid overflowing the ADC 99 (FIG. 3). Based on this comparison, which is accomplished in the network protocol controller 62 (FIG. 3) or the host computer or resource 52 (FIG. 2), the signals at 110 and 114 select the appropriate level of gain. The appropriate level of gain selected ensures that the amplitude critical signals which comprise the symbols following the calibration pulse will be amplified to an advantageous level for use in the ADC. This advantageous level will normally be nearer the upper limit of the conversion capability of the ADC for full strength signals, to achieve greater sensitivity and interval distinction between each of the amplitude critical signals. The greater amount of amplitude distinction between the discrete levels of the amplitude critical signals will result in a greater capability for accurately distinguishing one level from the other and for correctly converting the signal into its intended bit information.

It is possible to increase the number of gain levels by including additional resistors and switches connected to the input terminals of the receiver amplifier 92. Multiple levels of gain achieve maximum amplification of the incoming received signal 89 without allowing the signal to decrease to a relatively low level before amplification is applied. The level of the amplified received signal at 95 can be more closely maintained near its maximum value by using a relatively greater number of different gain levels to apply in amplifying the received signal, thereby maximizing the signal to noise ratio and increasing the precision by which the ADC 99 can distinguish and resolve the multiple different amplitudes of the received signal into the bit patterns which each amplitude critical signal represents.

It is also possible reduce the number of gain levels by eliminating one or more of the resistor switch combinations, but the reduction in gain levels carries with it certain disadvantages. For example, a two level gain embodiment of the present invention requires a maximum strength received signal 89 to decrease to an amplitude below one half of its maximum value before amplification of approximately 1.7 to 1.8 can be applied. If the received signal was amplified before it decreased below the one half level, the amplified received signal would distort to the point that it would overflow or overwhelm the ability of the ADC 99 to correctly decode the analog signal.

A number of gain levels greater than two obtains a significant improvement in reducing bit error decoding rates. By increasing the gain levels to four rather than two, the bit error rate is reduced by two orders of magnitude.

Selecting the level of gain to be employed in the gain select circuit 90 is accomplished by microcontroller functionality within the network protocol controller 62 (FIG. 3) or by software in the host computer or resource 52 (FIG. 2). This functionality is illustrated in FIG. 10, in which separate reference numbers are used to refer to functional features of steps of the program flow. Upon initial energization or power up of a node, a starting value of the gain is set at 120 as a default. For LAN interfaces, this starting value is advantageously selected as the third gain level (2, in the example above). For hubs, this starting value is selected as the lowest gain value (1 or unity in the example above). Later during operation of the LAN, an incoming received signal is detected at 121. The previously set starting gain value is selected from memory at 122 and a peak value of the incoming calibration pulse is latched at 123, for example in a buffer. The peak value latched is thereafter compared to a maximum level or limit at 124, to an intermediate level or limit at 126, and to a minimum level or limit at 128. The maximum allowable signal, the maximum limit, the intermediate limit and the minimum limit are graphically shown in FIGS. 11A and 11B at 130, 132, 134 and 136, respectively. The maximum, intermediate and minimum limits 132, 134 and 136 respectively, represent the points at which the four gain values will become operative. These limits also relate to the gain achieved.

Figure 11A:
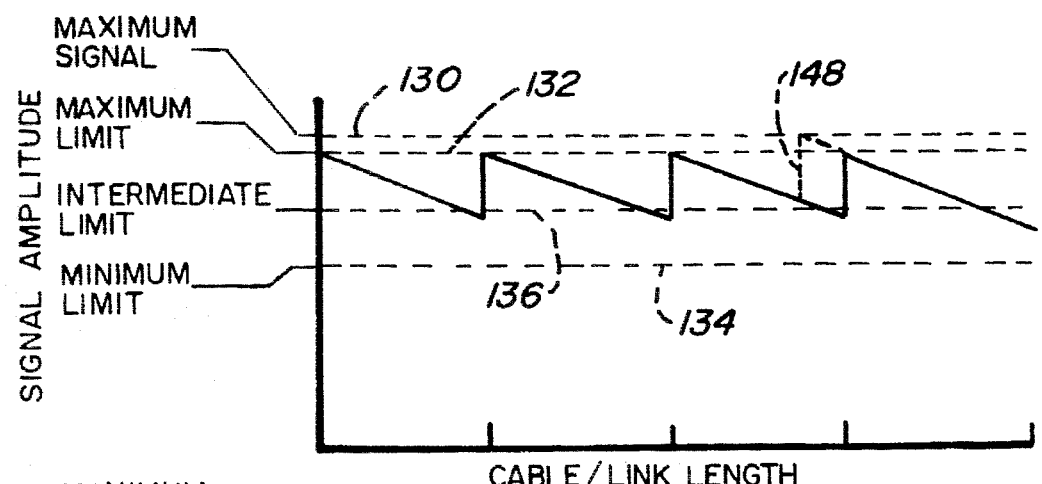
FIGS. 11A and 11B are graphs illustrating the signal level and amplification achieved by the selective and variable gain circuit shown in FIG. 9, relative to the inherent attenuation associated with cable or link length of the LAN medium shown in FIG. 1.
Figure 11B:
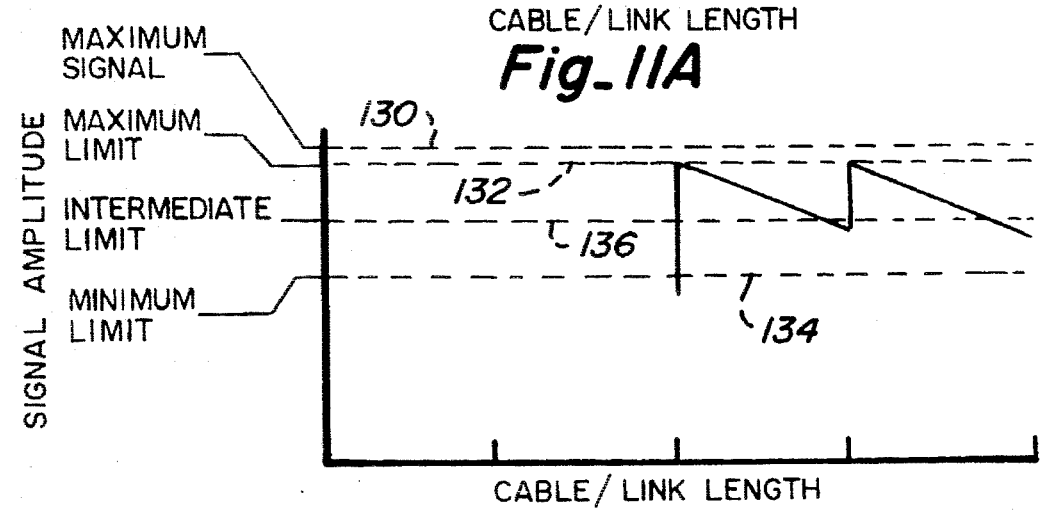

As shown in FIG. 10, the latched value of the calibration pulse is first compared at 124 to the maximum limit (132, FIGS. 11A and 11B). If the magnitude of the received calibration pulse is greater than the maximum limit, thereby indicating a possibility of overflowing the ADC and distorting the conversion of the magnitude of the amplitude critical signal into its correct digital pattern, the value of the gain level is decremented by one, as shown at 138. The program flow at 124 and 138 is therefore intended to correct the situation where the previous gain level established is too great.

After the gain value is decremented at 138, the program flow exits the gain adjustment routine at 140. Normal LAN operation then occurs as is represented at 142. When the next subsequent calibration pulse is received, the gain adjustment program flow again occurs as is shown by the transition from step 142 to step 121. If the latched value of the calibration pulse is still too great as determined at 124, the gain will again be decremented at 138.

In general, decrementing the gain level generally occurs only once if ever at all, and then only in a LAN interface, because the gain level at a hub is normally selected at the beginning to be the minimum level of gain. However there may be circumstances where a hub adjusts its gain upward, thereby causing a downstream effect where the amplitude of the signal received at a LAN interface could become excessive. Generally however, once the appropriate gain level is achieved, no further adjustment will be required.

If the latched value of the calibration pulse is not excessive as determined at 124, the latched value is then compared with the intermediate limit at 126. If the latched value of the calibration pulse is greater than the intermediate limit, no further amplification is desired and the program flow exits at 140. No further amplification is desired in the situation where the magnitude of the received calibration pulse exceeds the intermediate limit because further amplification is very likely to create a situation where the ADC would likely overflow and create decoding errors.

If the latched value of the calibration pulse is below the intermediate limit as determined at 126, it is further compared to the minimum limit at 128 before any adjustment occurs. If the latched value of the calibration pulse is also below the minimum limit as determined at 128, considerable amplification is required. In that circumstance, the gain value is incremented once at 144 and once again at 146, to increase the gain value by two levels (FIG. 11B). The program flow then exits at 140.

If the latched value of the calibration pulse is greater than the minimum limit as determined at 128, but less than the intermediate limit as determined at 126, the gain value is only incremented by one gain level as shown at 146. The program flow then exits the gain adjustment routine as shown at 140.

In this manner the gain is incremented only by a selected amount to achieve essentially a signal which is near the maximum limit 132 but which does not exceed the maximum signal level 130, as is shown in FIGS. 11A and 11B. When the signal level is normally in the range between the maximum and intermediate limits 132 and 134, adequate signal strength is present to obtain good decoding. Furthermore, by employing a second gain level (1.18 in the example above) which is slightly greater than the lowest unity gain level, a fine amplification level is achieved to obtain the best signal magnitudes for decoding. The other two gain levels (2 and 3 in the example above) are more substantial adjustments which are useful in adjusting substantially low amplitude signals into the desired magnitudes for enhanced decoding. By keeping the amplitudes of the received signals high, a greater signal to noise ratio is achieved. More difference between separate symbols which are decoded into the digital bit patterns also exists, and these greater incremental differences enhance the ability to correctly decode the signals.

By establishing a maximum level 132 which is less than the maximum allowable signal level 130 hysteresis in the gain amplification is established, as is shown by the dashed lines 148 in FIG. 11A. As the dash lines 148 show, the signal level is allowed to increase to the maximum 130 before the gain is reduced (at 124, 138, FIG. 10). This hysteresis prevents fluttering or oscillation in the level of amplification selected and thus prevents indeterminate gain level situations in which proper decoding is difficult or impossible.

Once the gain is established it is generally not changed as long as the node is active. The communication medium link between the node 40 and a hub 44 remains an unchanged characteristic and the amplification characteristics of the hub 44 remain constant after they are established.

The improved gain control features of the present invention are also advantageously incorporated in a hub 44. The typical functionality of the hubs 44 is achieved primarily by signal amplifiers. Although some types of hubs offer specific signal processing capability, many of the hubs simply act as signal repeaters and amplifiers. In the enhanced functionality for communicating between enhanced nodes 40 described in the above U.S. Patents, it is advantageous to utilize the gain control at each hub to maintain signal strength. To do so, it is necessary to decode each incoming signal into its appropriate digital value, thereby allowing the gain control aspects of the present invention to be utilized. After decoding the signal to the appropriate value, correcting for ISI and normalizing, the digital signal is then converted to back analog form and is transmitted from all of the other connections or ports of the hub to which medium links are connected, other than the medium link upon which the incoming signal was received.

Figure 12:
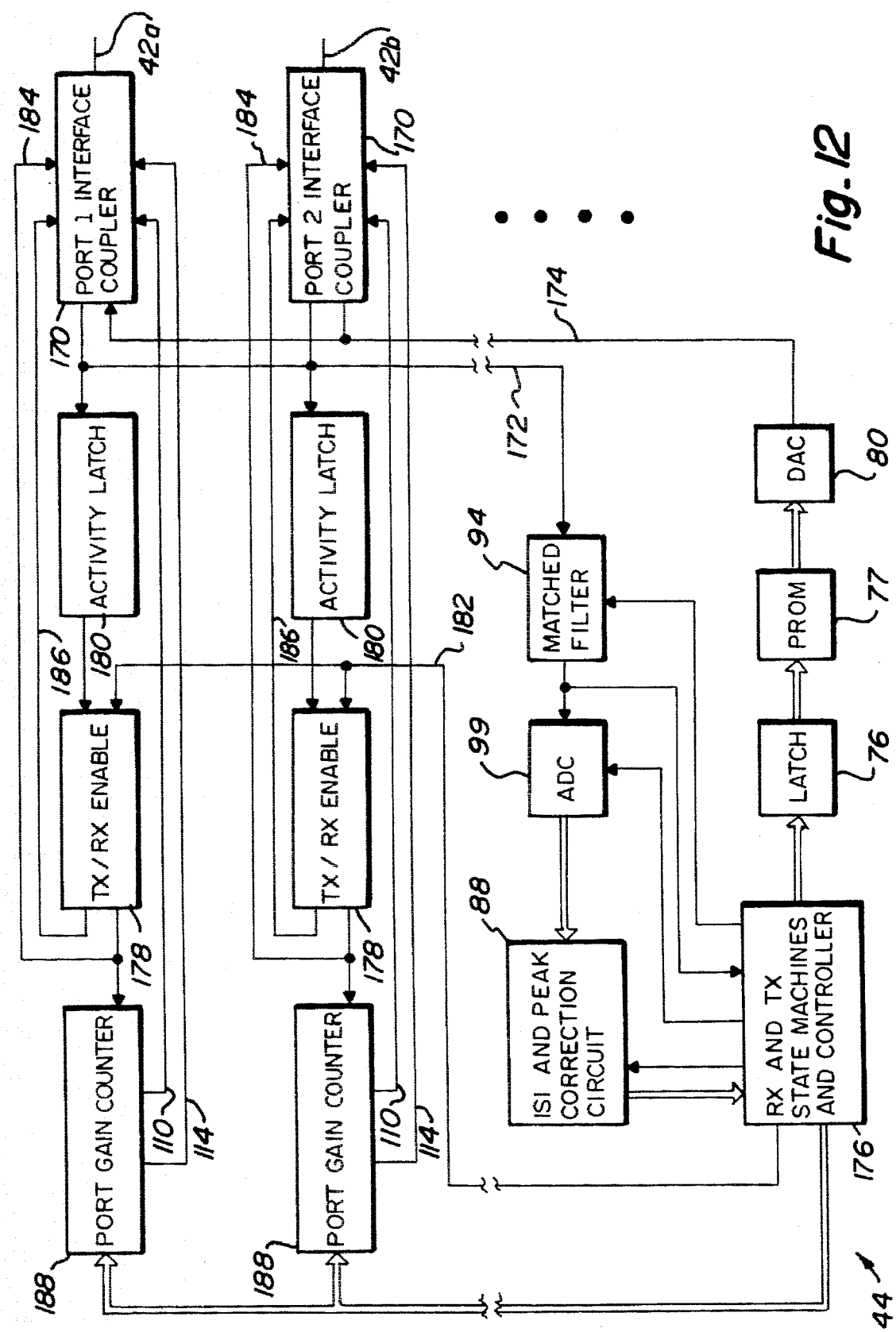
FIG. 12 is a block diagram of a hub of the LAN shown in FIG. 1.

A block diagram of a hub 44 which incorporates features of the present invention is shown in FIG. 12. Communication medium links 42a and 42b are shown connected to each of two port interface couplers 170. Although two port interface couplers 170 are shown in FIG. 12, it should be understood that hubs having between 4 and 16 ports are commonplace, and each port has its own separate interface coupler 170. A port is provided for each communication medium link 42 which is connected to the hub 44. The hub 44 shown in FIG. 12 incorporates many of the components of the interface shown in FIG. 3.

Incoming signals received from the medium links 42a and 42b are applied through the port interface couplers 170 to a receive conductor 172, shown in FIG. 12. The receive conductor 172 commonly connects all of the port interface couplers 170 and the matched filter 94. Analog signals to be transmitted from the hub on the port interface couplers 170 are applied by the DAC 80 on a transmit conductor 174. The transmit conductor 174 is also commonly connected to all of the port interface couplers.

When an incoming signal is detected and is present on the receive conductor 172, the matched filter 94 derives the impulse signal 95 (FIG. 8) which is applied to the DAC 80. The DAC converts the peak value of the impulse signal to a digital value and applies it to the ISI and normalization correction circuit. The ISI and normalization correction circuit corrects for the influences of ISI and normalizes the value and applies the corrected value to a receiver and transmitter state machine and controller 176. The state machine and controller 176 incorporates within it in a microsequencer or state machine to accomplish the functions of the synchronizer 87 (FIG. 3) and the gain control aspects described in conjunction with FIG. 10.

The state machine and controller 176 also controls a transmitter/receiver enable circuit 178 associated with each port interface coupler 170. When a port interface coupler 170 detects an incoming signal, the signal is applied to a latch 180. The information stored in the latch 180 indicates that the associated port has received an incoming signal. A signal representative of this fact is applied by the latch 180 to the associated enable circuit 178. Another signal from the state machine and controller 178 is applied at 182 to the enable circuit 178. The combination of the signal at 182 and the presence and absence of signals from each activity latch 180 causes each enable circuit 178 to detect the appropriate condition for activating either the transmitter amplifier or the receiver amplifier in each port interface coupler 170. Each enable circuit 178 supplies control signals at 184 and 186 to the port interface coupler 170.

The control signals 184 and 186 are employed to disconnect all of the receiver amplifiers in the port interface couplers 170 from the receive conductor 172 except that receiver amplifier at the port which has received the incoming signal. Similarly, the control signals 184 and 186 operatively connect all of the transmitter amplifiers of the port interface couplers 170 to those other ports upon which the outgoing signal will be transmitted from the hub.

Also associated with each port interface coupler 170 is a port gain counter 188. Each port gain counter 188 is incremented and decremented as discussed in conjunction with the program flow shown in FIG. 10. Each gain counter 188 receives signals from the state machine and controller 176 to increment decrement the amount of gain for the receiver amplifier of the associated port interface coupler 170 which receives an incoming signal. The state machine and controller 176 determines the appropriate level to increment and decrement each port gain counter 188 in the same manner as has been previously described in FIG. 10. However, the state machine and controller 176 establishes in each port gain counter a separate amount of gain for each individual port interface coupler.

The count value from each port gain counter is applied on the conductors 110 and 114 to the associated port interface coupler 170. The signals 110 and 114 control the gain of the receiver amplifier in the manner which has previously been described in conjunction with FIGS. 3 and 9.

Generally speaking, the gain selection will be established very rapidly after communications occur over the LAN, and will not thereafter adjust. Since each port is generally connected by a fixed length cable or link which is not subject to variations in impedance and thus will not attenuate the signals by variable amounts, the gain usually remains constant after it is once fixed. Some types of links, such as optical links and radio links, may have an associated variable attenuation characteristic, and in those cases the port gain counter value may be continually adjusted by the state machine and controller 176.

Figure 13:
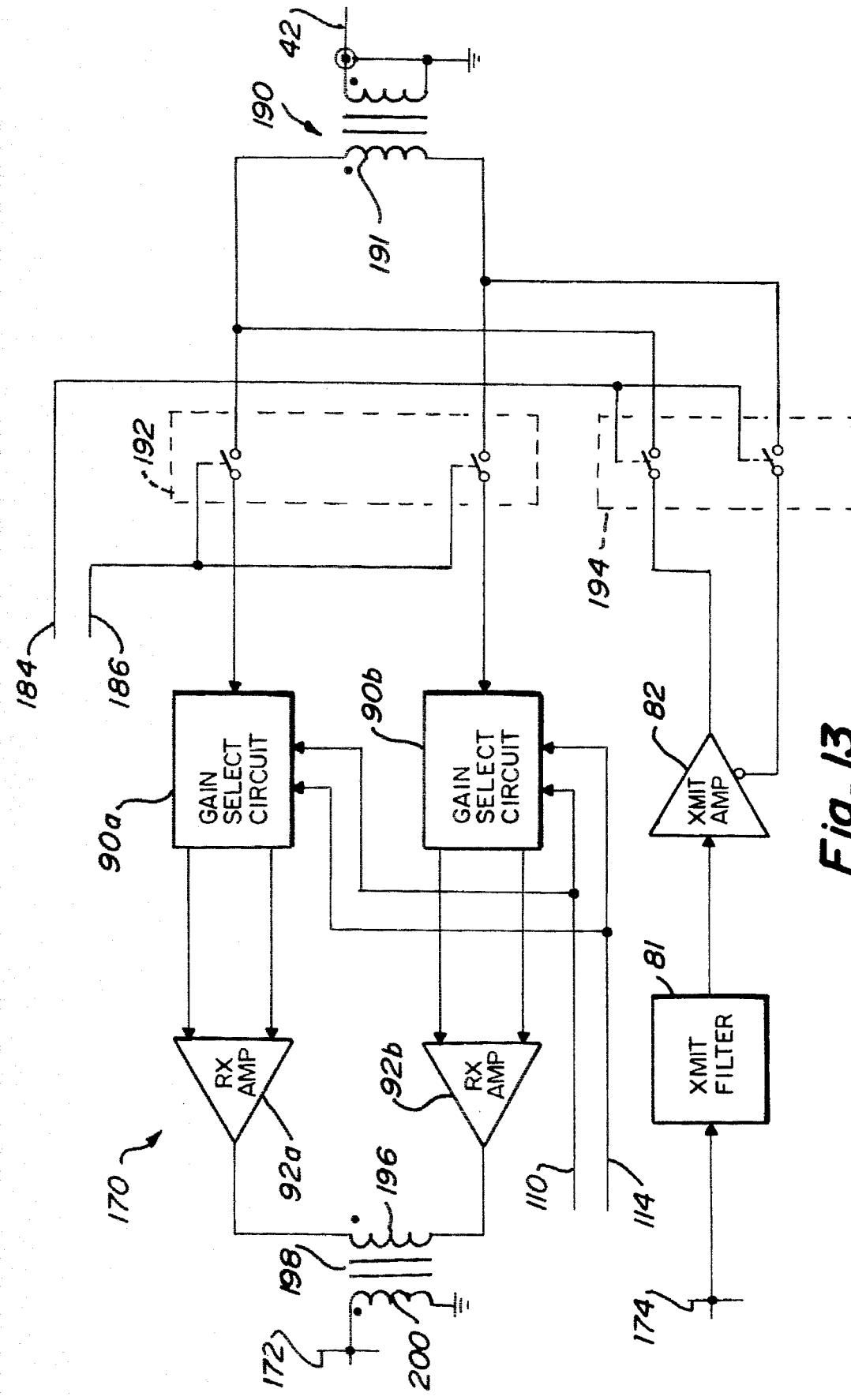
FIG. 13 is a schematic and block diagram of a portion of FIG. 12, illustrating a balanced noise cancellation circuit in which aspects of the present invention are also embodied.

More details concerning each port interface coupler 170 are shown in FIG. 13. Signals are applied from a communication link 42 through a transformer 190. The secondary winding of the transformer 190 is connected to a first pair of analog switches 192 and to a second pair of analog switches 194. The switches 192 are ganged together and are controlled by the control signal 186 applied from the transmitter/receiver enable circuit 178 (FIG. 12). Similarly, the switches 194 are ganged together and controlled by the control signal 184 applied from the transmitter receiver enable circuit 178 (FIG. 12). When the control signal at 186 closes the switches 192, the receiver is enabled in the port interface conductor 170. Simultaneously, the control signal at 184 opens the switch 194. For all other port interface couplers in the hub, the reverse state of the switches 192 and 194 exists, meaning that the transmitter is enabled by the closed switches 194 and the receiver is disabled by the open switches 192.

One particular problem associated with the analog switches, 192 and 194 is a common mode noise problem.

When the switches are open and closed by the control signals 184 and 186, spurious pulses of switching noise are injected which propagate throughout the circuit. These spurious pulses may modify the level of the received signal or have a pronounced influence on the impulse response of the matched filter to adversely influence the magnitude of the impulse signal 95 (FIG. 8) from which the digital value is derived by the ADC.

To reduce or eliminate the effect of this common mode switch noise, a balanced differential gain control circuit is employed. The balanced differential gain control circuit involves two gain select circuits 90a and 90b and two receiver amplifiers 92a and 92b, of the type previously described in conjunction with FIG. 9. One receiver amplifier and gain select circuit combination 90a and 92a is connected to one terminal of the secondary winding 191 of the transformer 190, and the other receiver amplifier and gain select circuit combination 90b and 92b is connected to the other terminal of the second winding 191. The signals amplified by the receiver amplifiers 92a and 92b are opposites or inversions of one another since the signals present at the opposite terminals of the secondary winding are 180 degrees out of phase with one another.

The gain select circuits 90a and 90b establish the same level of gain for the associated connected receiver 92a and 92b. In this manner, the same amount of amplification is achieved in each amplifier/gain select circuit combination 90a,92a and 90b, 92b.

The output signals are from the receiver amplifiers 92a and 92b are applied to the opposite terminals of a primary winding 196 of a transformer 198. A secondary winding 200 of the transformer 198 is connected at one terminal to reference potential and at its other terminal to the receive conductor 172 (FIG. 12).

The use of the balanced differential gain control circuit in the hubs effectively reduces or eliminates the affects of spurious impulses of induced common mode switch noise. Any such noise impulses have a similar, not opposite, effect on both channels of the differential gain control circuit. Those noise impulses are effectively subtracted from one another because of the differential nature of the two gain channels. The signals in the two individual channels are 180 degrees out of phase with one another due to the connection of each individual channel to an opposite end terminal of the secondary winding 191. The differential effect of two signals which are already 180 degrees out of phase of one another at the primary winding 196 is an additive effect. However, the differential effect of the noise is a cancellation when the signals are added at the primary winding 196. Thus the additive effect preserves and amplifies the desired sine pulse signal received from the medium 42, but eliminates the effect of induced common mode switch noise.

Although the analog switches 192 are shown connected between the gain select circuits 90a and 90b and the secondary winding 191 of the transformer 190, the switches could also be advantageously positioned between the output terminals of the receiver amplifiers 92a and 92b and the primary winding 196 of the transformer 196. Placed in this manner, the impedance of the receiver amplifiers do not load the receive conductor 172 and degrade signal strength, when the switches are open. Placement of the switches at the output terminals of the receiver amplifiers 92a and 92b still creates common mode switch noise.

The port interface coupler 170 also includes one transmit filter 81 and one transmit amplifier 82. Signals received on the transmit conductor 174 (FIG. 12) are conducted through the transmit filter 81 and amplified by the transmit amplifier 82, and applied through the closed analog switches 194 to the secondary winding 191 of the transformer 190. From the transformer 190 the amplified signals are applied to the medium 42.

The improved gain control features of the present invention are quickly and advantageously achieved by the gain select circuit. By maintaining a high level of the received signal due to the selective and incremental levels of amplification, the magnitude of amplitude critical signals communicated over the LAN medium is maintained at a high level relative to inherent noise for better discrimination and reduced errors when decoding the incoming signals. The relative distance between spacially separated nodes on the LAN medium may be increased since the selective levels of gain maintain a high signal level even under conditions of the increased attenuation arising from increased cable lengths. In addition the noise cancelling effects of the differential channel gain control circuit reduces or eliminates the noise and spurious signals which might adversely influence the integrity of communications over a LAN. The appropriate level of gain may be selected and achieved in response to the receipt and interpretation of a single calibration signal, thereby minimizing the signalling overhead necessary to achieve accurate gain adjustments. Many other advantages will be apparent after fully comprehending the improved aspects of the present invention.

A presently preferred embodiment of the invention and many of its improvements have been described with a degree of particularity. This description has been made by way of preferred example for implementing the invention, but the scope of the invention should not necessarily be limited by this description. The scope of the present invention is defined by the following claims.

The invention claimed is:

1. A common mode switching noise cancellation circuit for a local area network (LAN), the LAN having a plurality of nodes connected by a communication medium; each node including a transmitter to transmit outgoing information signals over the medium, a receiver to receive incoming information signals from the medium, and a plurality of switches which connect the transmitter to the medium and disconnect the receiver from the medium to transmit outgoing information signals to the medium and which connect the receiver to the medium and disconnect the transmitter from the medium to receive incoming information signals from the medium, the switch operation of connecting and disconnecting the transmitter and receiver creating common mode switching noise; said common mode switching noise cancellation circuit comprising:

a first circuit device connected to the medium and by the switches to the transmitter and the receiver, the first circuit device supplying a primary copy and an inverted copy of each incoming information signal, the common mode switching noise being essentially equal in polarity and magnitude on both the primary and inverted copies;

a first receiver amplifier connected through the switches to receive the primary copy of the incoming information signal;

a second receiver amplifier connected through the switches to receive the inverted copy of the incoming information signal;

the first and second receiver amplifiers establishing a similar level of gain for the primary and inverted copies of the incoming information signal and for the common node noise associated with each of the primary and inverted copies; and a second circuit device connected to the first and second receiver amplifiers and operative to combine the primary and inverted copies in an additive manner to produce a reproduced version of the incoming information signal, the combination of the primary and inverted copies also effectively subtracting the common node noise in the primary and inverted copies to eliminate the effect of the common mode switching noise in the reproduced version of the incoming information signal.

2. A common mode switching noise cancellation circuit as defined in claim 1, wherein the LAN includes a hub having a plurality of ports to connect to separate portions of the medium, the hub receives an incoming information signal at one port and transmits a related outgoing information signal at other ports, each port includes a receiver, a transmitter and a plurality of switches by which to connect the transmitter and receiver to transmit and receive the outgoing and incoming information signals, respectively; and wherein:

one said common mode switching noise cancellation circuit is associated with each receiver at each port; and the common mode noise induced in the primary and inverted copies of the incoming information signal results from the switch operation of all of the switches of the hub.

3. A common mode switching noise cancellation circuit as defined in claim 2, wherein each port of the hub further comprises:

a port gain control circuit to establish the level of gain for each first and second receiver amplifier independently of the level of gain of the receiver amplifiers of the other ports of the hub.

4. A common mode switching noise cancellation circuit as defined in claim 3, wherein:

the incoming and outgoing information signals are amplitude critical signals in which the amplitude of the signal represents data; and the amplified version of the incoming information signal is supplied to a matched filter.

5. A common mode switching noise cancellation circuit as defined in claim 4, wherein:

a calibration information signal is periodically included in the incoming information signals, and the port gain control circuit establishes the level of gain in response to the calibration information signal.

6. A common mode switching noise cancellation circuit as defined in claim 1, wherein:

the incoming and outgoing information signals are amplitude critical signals in which the amplitude of the signal represents data; and the amplified version of the incoming information signal is supplied to a matched filter.

7. A common mode switching noise cancellation circuit as defined in claim 1, wherein:

the second circuit device comprises a transformer.

8. A common mode switching noise cancellation circuit as defined in claim 7, wherein:

the first circuit device comprises a transformer.

9. A method of reducing errors when decoding information signals communicated between nodes in a local area network (LAN), the LAN having a plurality of nodes connected by a communication medium; each node including a transmitter to transmit information signals over the medium, a receiver to receive information signals from the medium, and a plurality of switches which connect the transmitter to the medium and disconnect the receiver from the medium to transmit outgoing information signals to the medium and which connect the receiver to the medium and disconnect the transmitter from the medium to receive incoming information signals from the medium, the switch operation of connecting and disconnecting the transmitter and receiver creating common mode switching noise; said error reduction method comprising the steps of:

creating a primary copy of the incoming information signal;

creating an inverted copy of the incoming information signal;

inducing common mode noise of essentially equal polarity and magnitude into the primary and inverted copies by switch operation;

selectively amplifying the primary and secondary copies by a predetermined equal amplification level;

combining the amplified primary and inverted copies in an additive manner to produce a reproduced version of the incoming signal; and subtracting the influence of the common mode noise from the primary and inverted copy signals when combined to cancel the common mode noise from the amplified version of the incoming signal.

10. An error reducing method as defined in claim 9, wherein the LAN includes a hub having a plurality of ports to connect separate portions of the medium, the hub receives an incoming information signal at one port and transmits a related outgoing information signal at other ports, each port includes a receiver, a transmitter and a plurality of switches by which to connect the transmitter and receiver to transmit and receive the outgoing and incoming information signals, respectively; said method further comprising the steps of:

creating the primary and inverted copies at a port receiving an incoming information signal;

deriving a reproduced version of the incoming information signal at each port by combining the primary and inverted copies created at each port; and transmitting the reproduced version of the incoming information signal at the other ports of the hub.

11. An error reducing method as defined in claim 10, further comprising the step of:

establishing the predetermined level of amplification for each of the primary and inverted copies at each port independently of the level of amplification established at the other ports of the hub.

12. An error reducing method as defined in claim 11, further comprising the steps of:

representing data by the amplitude of the incoming and outgoing information signals; and applying the amplified version of the incoming information signal to a matched filter.

13. An error reducing method as defined in claim 12, further comprising the steps of:

periodically including a calibration information signal in the incoming information signals; and establishing the level of gain at each port in response to the calibration information signal.

14. An error reducing method as define in claim 9, further comprising the steps of:

representing data by the amplitude of the incoming and outgoing information signals; and applying the amplified version of the incoming information signal to a matched filter.

15. An error reducing method as define in claim 9, further comprising the step of:

combining the primary and inverted copies by applying them to a transformer.

* * * * *